June 21, 1960 J. ROEDER, JR 2,942,051
REFRIGERATING APPARATUS
Filed March 11, 1958

INVENTOR.
John Roeder Jr.
BY
Schroeder, Hofgren, Brady & Wegner
attorneys 2,942,051

REFRIGERATING APPARATUS

John Roeder, Jr., Benton Harbor, Mich., assignor to Whirlpool Corporation, a corporation of Delaware Filed Mar. 11, 1958, Ser. No. 720,793

9 Claims. (Cl. 136—4)

This invention relates to a thermoelectric assembly.

In heating or cooling by means of a thermoelectric device, thermocouple means are provided in which hot and cold junctions are produced between pairs of dissimilar thermoelectric elements when thermoelectrically interconnected to either pump heat to or extract heat from one side of the device. In such devices it is desirable to have a structurally strong assembly to withstand abuse, to be able to insert or replace a defective element and to provide relatively unbreakable joints between the interengaging faces of the thermoelectric element and its associated terminal members.

One of the features of this invention is to provide an improved thermoelectric assembly comprising a thermoelectric element having spaced surfaces, a first contact member adjacent to one of said surfaces, a second contact member adjacent to the other of said surfaces, means at each of said surfaces making electrically conducting contact between the surface and the corresponding contact member, and an enclosing substantially air impervious sleeve member surrounding said element and said conducting means.

Other features and advantages of the invention will be apparent from the illustrative embodiment of the invention shown in the accompanying drawings. Of the drawings.

Figure 1:
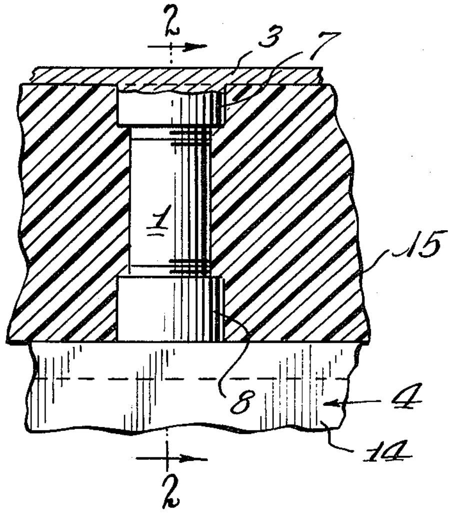
Figure 1 is a side elevational view of a thermoelectric assembly with the thermal and electrical insulating material shown in section and with one of the terminal members shown in partial section.
Figure 2:
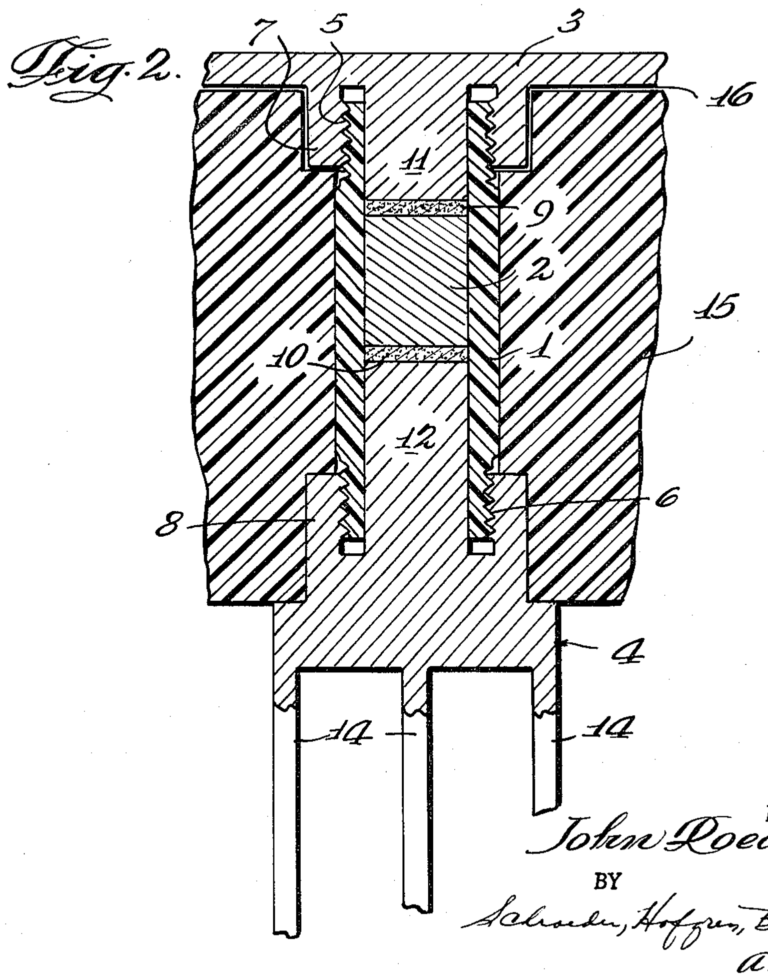
Figure 2 is a vertical section taken substantially along the line 2—2 of Figure 1.

In the thermoelectric assembly shown in the accompanying drawings a hollow connector 1 receives a thermoelectric element 2 and a pair of spaced apart terminal members 3 and 4 are at opposite ends thereof and fastened thereto.

The thermoelectric assembly, when associated with a dissimilar thermoelectric element, forms a thermoelectric couple having a hot junction on one side and a cold junction on the other when the couple is subjected to a thermoelectric current. Such thermocouples and their operation are, of course, well known to those skilled in the art.

In the embodiment disclosed the hollow connector or sleeve 1 is formed of an air impervious electrical insulating material. This may be a rigid plastic, such as nylon or a ceramic material having low electrical conductivity. Here the connector is threadably connected at one end as indicated at 5, to a collar 7 on the terminal member 3 which is formed of electrically conducting material, preferably copper or aluminum.

The opposite end of the hollow connector 1 is similarly threadably fastened to a collar 8 on the terminal member 4 as indicated at 6. The member 4 is also formed of electrically conducting material, preferably copper or aluminum.

A deposit of a very soft electrically conducting material is placed at each end of the thermoelectric element 2 and these deposits take the shape of discs 9 and 10 when compressed. The material may be formed of copper or aluminum powder or paste. These are well known in the prior art. Silver powder or paste, dead soft aluminum or copper and the like may be used if desired.

Each of the terminal members 3 and 4 have projections 11 and 12, respectively, extending inwardly toward each other to fit closely within the ends of the hollow connector 1 to engage the electrically conducting discs 9 and 10 and make electrical contact with the element 2.

In the embodiment shown terminal member 3 is intended to be a heat absorber plate. The terminal member 4 is intended to be a heat dissipator plate and is provided with fins 14 to aid in heat transfer with the surrounding environment.

In assembly of the device, or in replacing a thermoelectric element 2, the terminal member 3 may be disconnected from the hollow connector 1 to then open the inside of the hollow connector to give access to the element 2. The terminal member 3 may then be threaded on the hollow connector 1 and moved toward the terminal member 4 a distance sufficient to tightly compress the discs 9 and 10 at the opposite ends of the thermoelectric element 2 to insure good electrical contact between the parts.

The space between the terminal members 3 and 4 is filled with a thermal and electrical insulating material 15. The thermal and electrical insulating material may be any of the well known plastics, preferably a foamed plastic that is substantially rigid and that preferably is foamed in place. Among the foamed plastics that may be used are foamed polystyrene, foamed polyurethane and the like. Because of its excellent physical properties and because it may be foamed in place to adhere firmly to the surfaces which it contacts to produce a rigid block, a foamed, rigid polyurethane is preferred. These are well known and widely used materials and are easily produced. In general the foamed, rigid polyurethanes are produced by reacting an organic diisocyanate such as toluene 2,4-diisocyanate with a polyester of a dibasic acid and a trihydric alcohol in which the ester contains free hydroxy and carboxylic groups with the reaction taking place in the presence of water. Methods of producing such rigid polyurethane foams are disclosed, for example, in U.S. Patent 2,577,281 with Example 17 showing an excellent method of preparing such a rigid foam.

In a method disclosed in the above patent an alkyl resin is first produced as by reacting 4 mols of glycerol and 2.5 mols of adipic acid in the presence of 0.5 mol of phthalic anhydride. This resin is the polyester. This resin is then reacted with the diisocyanate and preferably water as the foaming agent, also preferably in the presence of a non-ionic wetting agent to promote more uniform cell formation. A catalyst such as benzoyl peroxide is also preferably included and if desired a flame retarding agent such as is disclosed in the patent.

In order to prevent adherence of the terminal member 3 to the insulating material 15 so that the terminal member may be rotated, a sheet of plastic 16 such as Mylar is placed on the inner side of the terminal member 3.

The structure disclosed herein provides a sturdy interconnection between the terminal members and thermoelectric element without requiring soldered connections which are usually fragile and easily broken accidentally. In the structure of this invention the stress is taken by the hollow connector 1. The connector tightly presses the terminal members 3 and 4 against the thermoelectric element 2 as they are drawn together. The threaded fastening of the parts also simplifies servicing as it is easy to replace a defective thermoelectric element. In order to reduce corrosion within the hollow connector 1 the threaded connections 5 and 6 may be sealed as by means of a suitable compound. The interior of the connector may then be evacuated of air or may be filled with an inert gas such as nitrogen to form a non-oxidizing environment.

Having described my invention as related to the embodiment shown in the accompanying drawings, it is my intention that the invention be not limited by any of the details of description, unless otherwise specified, but rather be construed broadly within its spirit and scope as set out in the accompanying claims.

I claim:

1. A thermoelectric assembly, comprising: a pre-formed thermoelectric element having spaced surfaces; a first contact member adjacent one of said surfaces; a second contact member adjacent the other of said surfaces; means at each of said surfaces making electrically conducting contact at all times between the surface and the corresponding contact member; and an enclosing substantially air impervious dielectric sleeve member surrounding said element and said conducting means at least one of said contact members being fastened adjustably to means associated with said sleeve member for movement toward said contact means to effect the electrically conducting contact between said one contact member and said contact means.

2. The assembly of claim 1 wherein one of said contact members is readily removable to provide access to said element.

3. A thermoelectric assembly, comprising: a hollow dielectric connector; and a pre-formed thermoelectric element within said connector providing hot and cold junctions when thermoelectrically connected to a dissimilar element, said junctions including a pair of spaced apart terminal members fastened to said connector to prevent movement away from each other and positioned one adjacent each end thereof in electrically conducting relation at all times with opposite ends of said thermoelectric element at least one of said terminal members being fastened adjustably to means associated with said connector for movement toward said element to effect the electrically conducting contact between said terminal member and said element.

4. A thermoelectric assembly, comprising: spaced apart terminal members forming heat dissipator and absorber members, respectively; a hollow connector extended between said terminal members; means threadably connecting the terminal members to said connector adjacent opposite ends thereof; a thermoelectric element within said connector intermediate the ends thereof providing hot and cold junctions when thermoelectrically connected to a dissimilar element; electrically conducting material covering both ends of said element; and means on said terminal members extending inwardly toward each other and into said connector whereby relative rotation of the connector and a terminal member tightly compresses said material.

5. The thermoelectric assembly of claim 4 in which the connecting means forms an air tight seal.

6. The thermoelectric assembly of claim 4 wherein the space between said terminal members is filled with a thermal and electrical insulating material non-adhering to at least one of said terminal members whereby said terminal member may rotate relative to said connector.

7. A thermoelectric assembly, comprising: spaced apart terminal members of thermal and electrical conducting material; a hollow dielectric connector threadably connected adjacent each of its ends to said terminal members; a thermoelectric element within said connector to provide hot and cold junctions when thermoelectrically connected to a dissimilar element with both subjected to a thermoelectric current, opposite ends of the element facing said terminal members; and projections on said terminal members extending inwardly toward each other and into electrically conducting relation with the ends of said element.

8. A thermoelectric assembly, comprising: a hollow dielectric connector; and a thermoelectric element within said connector providing hot and cold junctions when thermoelectrically connected to a dissimilar element, said junctions including a pair of spaced apart terminal members fastened to said connector and positioned one adjacent each end thereof in electrically conducting relation with opposite ends of said thermoelectric element, and wherein one of the terminal members threadably engages said connector.

9. A thermoelectric assembly, comprising: a hollow dielectric connector; and a thermoelectric element within said connector providing hot and cold junctions when thermoelectrically connected to a dissimilar element, said junctions including a pair of spaced apart terminal members fastened to said connector and positioned one adjacent each end thereof in electrically conducting relation with opposite ends of said thermoelectric element, and wherein there is provided a deposit of flowable electrically conducting material at each end of said element.

References Cited in the file of this patent

UNITED STATES PATENTS

| | | |
|---|---|---|
| 1,848,655 | Petrik | Mar. 8, 1932 |
| 2,844,638 | Lindenblad | July 22, 1958 |
| 2,858,350 | Fritts et al. | Oct. 28, 1958 |